United States Patent
Adams et al.

(10) Patent No.: US 8,152,066 B2
(45) Date of Patent: Apr. 10, 2012

(54) METHOD AND SYSTEM FOR DETERMINING SUPPORT FOR A MEMORY CARD

(75) Inventors: Neil P. Adams, Waterloo (CA); Herbert A. Little, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 404 days.

(21) Appl. No.: 11/465,232

(22) Filed: Aug. 17, 2006

(65) Prior Publication Data

US 2008/0041951 A1 Feb. 21, 2008

(51) Int. Cl.
*G06K 7/00* (2006.01)
(52) U.S. Cl. .................................. 235/435; 370/252
(58) Field of Classification Search .................. 235/435; 370/252
See application file for complete search history.

(56) References Cited

U.S. PATENT DOCUMENTS

| | | | |
|---|---|---|---|
| 6,557,754 B2 * | 5/2003 | Gray et al. | 235/375 |
| 6,578,768 B1 * | 6/2003 | Binder et al. | 235/492 |
| 7,062,584 B1 * | 6/2006 | Worrell et al. | 710/301 |
| 2004/0036494 A1 | 2/2004 | Mak et al. | |
| 2004/0073736 A1 * | 4/2004 | Oh et al. | 710/301 |
| 2004/0123114 A1 * | 6/2004 | McGowan | 713/186 |
| 2004/0236991 A1 | 11/2004 | Brundridge et al. | |
| 2005/0099950 A1 | 5/2005 | Koga | |
| 2005/0132352 A1 * | 6/2005 | Shen | 717/174 |
| 2006/0209710 A1 | 9/2006 | Watanabe | |

FOREIGN PATENT DOCUMENTS

EP 1 667 389 6/2006

OTHER PUBLICATIONS

European Search Report dated Feb. 19, 2007, European Application No. 06119121.9.
European Examination Report dated Aug. 11, 2009, European Patent Application No. 06119121.9.

* cited by examiner

*Primary Examiner* — Daniel Hess
*Assistant Examiner* — Rafferty Kelly
(74) *Attorney, Agent, or Firm* — Bereskin & Parr LLP/S.E.N.C.R.L., s.r.l.

(57) ABSTRACT

Embodiments related to methods and systems for determining support for a memory card, where the memory card is accessible to a card reader and the card reader is in communication with an accessing device. One embodiment relates to a method comprising: a) transmitting a session request from the accessing device to the memory card via the card reader; b) receiving a first response to the session request from the memory card, the first response comprising first data related to a type of the memory card; c) determining at the accessing device that the memory card type is not recognized by any of a plurality of card drivers on the accessing device, based on the first data; d) for a selected one of the plurality of card drivers, transmitting a test command to the memory card, the test command being specific to a selected card type; e) receiving at the selected card driver a second response to the test command; and f) determining from the second response whether the selected card type corresponds to the memory card type and is supported by the selected card driver.

25 Claims, 6 Drawing Sheets

METHOD AND SYSTEM FOR DETERMINING SUPPORT FOR A MEMORY CARD

TECHNICAL FIELD

Embodiments relate to methods and systems for determining support for a memory card, where the memory card is accessible to a card reader and the card reader is in communication with an accessing device.

BACKGROUND

Some companies or agencies create specifications for middleware applications that are loaded onto smart cards. Many different smart card vendors can create smart cards which have the middleware applications on them. For example, for common access cards (CAC), there are about seven different smart card vendors.

A separate client application needs to be written for each accessing device to communicate with the middleware application on the smart card. The accessing device needs to have a different smart card driver for each smart card type (or middleware) it needs to support. When a smart card becomes accessible to a card reader in communication with an accessing device, the accessing device determines which of the card drivers it stores should be used to communicate with that smart card. This may be done by asking the smart card for its Answer To Reset (ATR) and then asking each card driver if it recognizes the ATR. If no drivers recognize and support the ATR, then the accessing device is unable to communicate with the smart card.

The ATR is an array of bytes that contains protocol information. Part of the ATR contains "historical bytes" that are vendor specific. A vendor that creates its own middleware for its card may encode the same historical bytes in all of its smart cards that will need to be supported by its client software. This way, if the vendor creates a new smart card (for example, with more memory), the new card will be supported by the old client software.

A problem occurs when different card vendors create cards which support common middleware and need to be understood by different client software on the accessing device. In this case, each card has different historical bytes so the client software needs to "hard code" support for each card (via the ATR). When a new card vendor is introduced, it may require a software update for the accessing device client software to add support for the new card by encoding the new card's ATR into the client software. Creating new client software is time-consuming and costly to deploy.

BRIEF DESCRIPTION OF THE DRAWINGS

Embodiments are described in further detail below, by way of example only, with reference to the accompanying drawings, in which.

DETAILED DESCRIPTION

Figure 1:
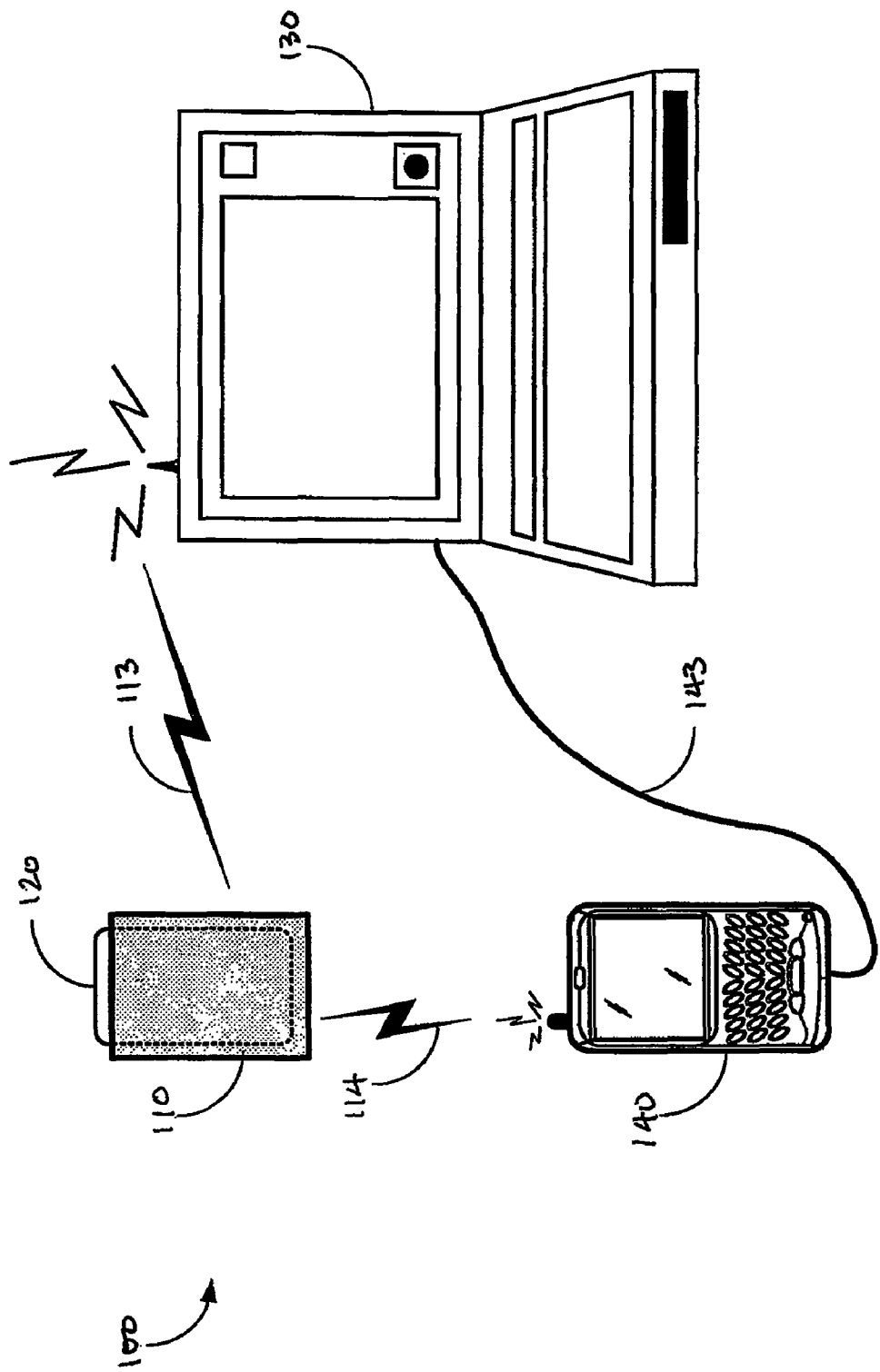
FIG. 1 is a block diagram of a system for accessing a memory card.

Embodiments relate to methods and systems for determining support for a memory card, where the memory card is accessible to a card reader and the card reader is in communication with an accessing device.

Certain embodiments relate to a method of testing support for a memory card that is not recognized by an accessing device, comprising: a) for a selected one of a plurality of card drivers in the accessing device, transmitting a test command to the memory card, the test command being specific to a selected card type; b) receiving at the selected card driver a response to the test command; and c) determining from the response whether the selected card type corresponds to a memory card type of the memory card and is supported by the selected card driver.

Other embodiments relate to a method for determining support for a memory card, wherein the memory card is accessible to a card reader and the card reader is in communication with an accessing device. The method comprises: a) transmitting a session request from the accessing device to the memory card via the card reader; b) receiving a first response to the session request from the memory card, the first response comprising first data related to a type of the memory card; c) determining at the accessing device that the memory card type is not recognized by any of a plurality of card drivers on the accessing device, based on the first data; d) for a selected one of the plurality of card drivers, transmitting a test command to the memory card, the test command being specific to a selected card type; e) receiving at the selected card driver a second response to the test command; and f) determining from the second response whether the selected card type corresponds to the memory card type and is supported by the selected card driver.

The test command may be selected from a plurality of different test commands. The test command may be selected from the group consisting of: a file selection command to select a file at a specific location on the memory card, a file read command to read a unique identifier of the memory card and a command specific to the selected card type. The file selection command may select one or more certificate files normally located at the specific location for the selected card type.

Steps d), e) and f) may be repeated for each of the plurality of different test commands until it is determined that the selected card type corresponds to the memory card type or that the selected card driver does not support the selected card type. Steps d), e) and f) may be repeated for each of the plurality of card drivers until it is determined that the selected card type for one or more of the plurality of card drivers corresponds to the memory card type or that none of the plurality of card drivers supports the memory card type.

Step d) may comprise opening a session between the selected card driver and the memory card to transmit the test command and receive the second response.

The memory card may be a smart card. The smart card may be a common access card (CAC). The first response may be an Answer to Reset (ATR) response. The accessing device may be a mobile electronic device or a personal computer.

Further embodiments relate to a system for determining support for a memory card accessible to a card reader. The system comprises: a processor within an accessing device in communication with the card reader and a memory accessible to the processor. The memory stores program code executable by the processor. The program code comprises a plurality of card driver modules and a card interface module. The card interface module is configured to facilitate communication with the memory card and the card drivers to determine that a memory card type of the memory card is not recognized by any of the card drivers. In response to determining that the memory card type is not recognized, the card interface module causes at least one of the card driver modules to transmit a test command to the memory card, the test command being specific to a selected card type. The at least one card driver module is configured to determine from a response to the test command whether the selected card type corresponds to the memory card type and is supported by the at least one card driver module.

The card interface module may determine that the memory card type is not recognized when each card driver module indicates that it does not recognize data received from the memory card that relates to the memory card type.

The test command may be selected from a plurality of different test commands specific to the card type. The test command may be selected from a group consisting of: a file selection command to select a file at a specific location on the memory card; a file read command to read a unique identifier of the memory card; and a command specific to the selected card type. The file selection command may select one or more certificate files normally located at the specific location for the selected card type.

The at least one card driver module may open a session with the memory card via the card reader in order to transmit the test command and receive the response.

The memory card may be a smart card. The smart card may be a common access card (CAC). The accessing device may be a mobile electronic device or a personal computer.

FIG. 1 depicts a system 100 for accessing a memory card 120 received by, or otherwise electronically coupled with, a card reader 110. System 100 may include multiple computing devices in communication with card reader 110 over a wireless interface. Such computing devices may include one or more wireless-enabled personal computers 130 and wireless-enabled mobile devices 140. Each of the computing devices has a wireless transceiver for communicating with card reader 110, which also has a wireless transceiver, over a communication link 113 or 114. In an alternative embodiment, either of the mobile device 140 or personal computer 130 may be in communication with card reader 110 via a wired connection, such as a universal serial bus (USB) cable.

The mobile device 140 may be any suitable wirelessly enabled handheld mobile device. The mobile device 140 may be a dual mode (data and voice) communication device and personal digital assistant device, such as is described in further detail below in relation to FIG. 3. Alternatively, the mobile device may be a single mode (data) communication device. The mobile device 140 may be capable of e-mail communication. The user of mobile device 140 may be required to authenticate itself for use of the mobile device 140 by providing a password or a personal identification number (PIN) code, for example to unlock a user interface of mobile device 140, to digitally sign a message or to decrypt an encrypted message.

Personal computer 130 may be any kind of computer, such as a normal desktop computer, laptop or other portable or fixed computer system which may require access to memory card 120. While computing device 130 is described as being a PC, it should be understood that it need not be of a particular type of computer, nor must it run a particular operating system. While not specifically shown in FIG. 1, PC 130 is enabled for wireless and/or wired communication with card reader 110 in a manner compatible with the communication capabilities of card reader 110 described below in relation to FIG. 2.

FIG. 1 further illustrates a communication link 143 between mobile device 140 and PC 130, which may be established over a wireless interface or via a wired connection, such as a USB cable.

Memory card 120 may be a smart card. Smart cards are personalized security devices, defined by the ISO 7816 standard and its derivatives, as published by the International Organization for Standardization. A smart card may have a form factor of a credit card and may include a semiconductor device. The semiconductor device may include a memory that can be programmed with security information, for example such as a private decryption key, a private signing key, biometrics information or an authentication certificate. The semiconductor device may include a decryption engine, such as a processor and/or dedicated logic circuitry for performing decryption and/or authentication functions. The smart card may include a connector for powering the semiconductor device and performing serial communication with an external device, such as card reader 110.

Smart cards generally have exposed contacts on one surface of the card for establishing electrical contact with corresponding contacts on the card reader, thereby facilitating communication between the smart card and the card reader. In one embodiment, memory card 120 and card reader 110 use electrical contact to establish communication therebetween. Although memory card 120 may be physically received in card reader 110, it is not essential that card reader 110 physically receive or contact memory card 120 in order to establish communication therebetween. For example, in an alternative embodiment, memory card 120 may interface with card reader 110 using radio frequency identification (RFID) technology. In such an alternative embodiment, the memory card 120 need only be sufficiently proximate to card reader 110 to enable radio frequency communication therebetween.

Mobile device 140 may be enabled to communicate with a wireless network (not shown). The wireless network may be implemented as a packet-based cellular network that includes a number of base stations each providing wireless Radio Frequency (RF) coverage to a corresponding area or cell. For example, the wireless network could conform to one or more of the following, among other network standards: Mobitex Radio Network; DataTAC; Global System for Mobile Communication (GSM); General Packet Radio System (GPRS); Time Division Multiple Access (TDMA); Code Division Multiple Access (CDMA); Cellular Digital Packet Data (CDPD); integrated Digital Enhanced Network (iDEN); or various other third generation networks such as Enhanced Data rates for GSM Evolution (EDGE) or Universal Mobile Telecommunications Systems (UMTS).

In some embodiments, instead of, or in addition to, a wireless wide area network, the wireless network may include a wireless local area network, such as, for example, a wireless local area network that conforms to one or more IEEE 802.11 standards, such as 802.11b, 802.11g and 802.11n. In at least some example embodiments, the wireless network is connected, through intermediate communications links (not shown), including, for example, links through the Internet, to one or more enterprise networks (not shown). Typically, such enterprise networks are each associated with a set of respective mobile devices 140, such that the mobile devices 140 are each enabled to exchange electronic messages and other information with the enterprise networks with which the mobile devices 140 are associated.

Figure 2:
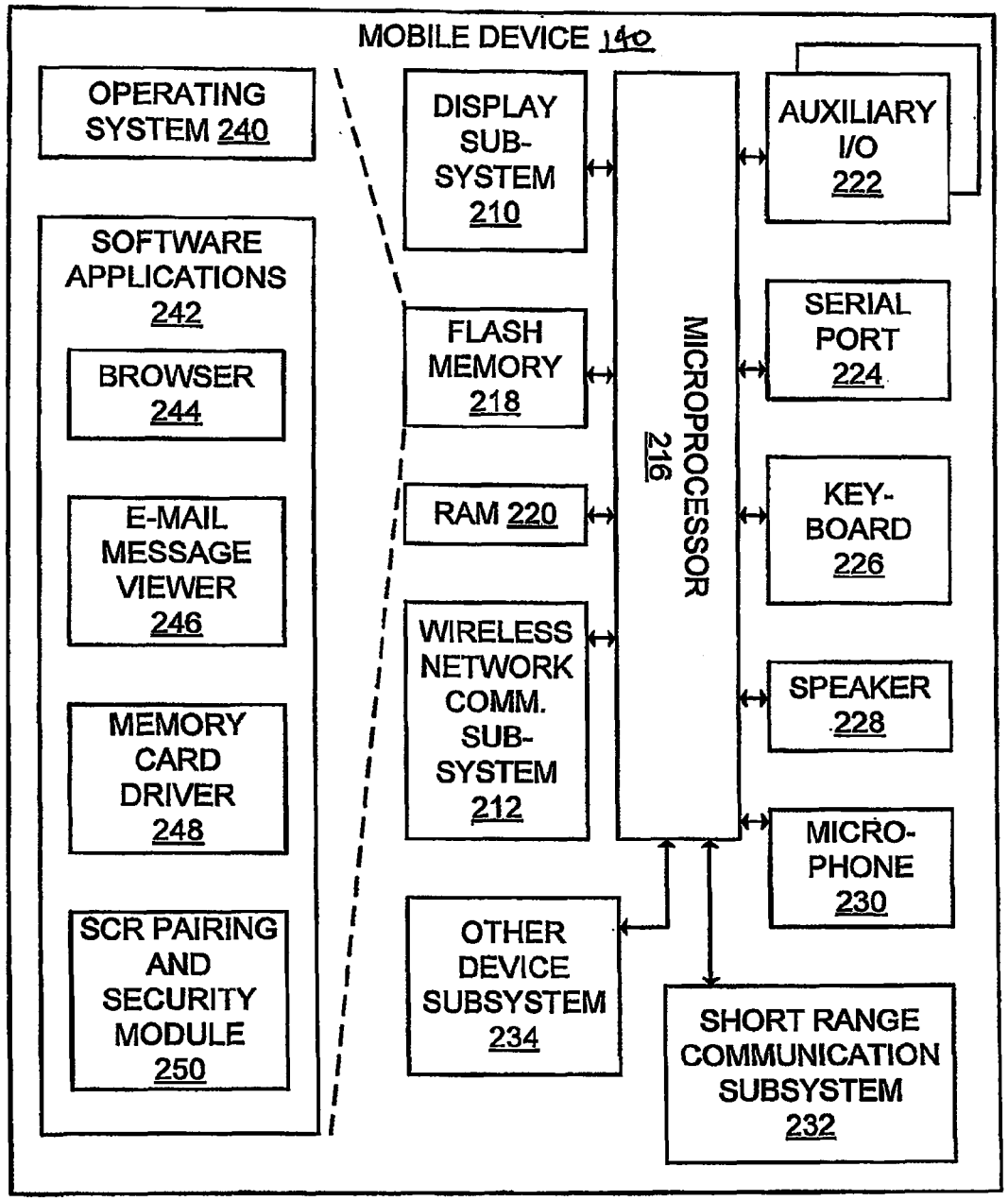
FIG. 2 is a block diagram of a mobile device for use in the system of FIG. 1.

FIG. 2 illustrates a detailed embodiment of the mobile device 140. The mobile device 140 includes a display subsystem 210 and a wireless network communication subsystem 212 for two-way communications with the wireless network. According to one embodiment, the communications subsystem 212 includes antennas (not shown), RF transceivers (not shown) and some signal processing capabilities that may be implemented, for example, by a digital signal processor (not shown). The mobile device 140 also includes a controller in the form of at least one mobile device microprocessor 216 that is suitably programmed to control the overall operation and functions of the mobile device 140, which are described in more detail below.

The mobile device 140 includes peripheral devices or subsystems such as a flash memory 218, a random access memory (RAM) 220, an auxiliary input/output (I/O) subsystem 222 (e.g., a scroll wheel), a serial port 224 (e.g., a Universal Serial Bus, or "USB", port), an input device 226 (e.g., a keyboard or keypad), a speaker 228, a microphone 230, a mobile device short-range communications subsystem 232 (e.g., an infrared transceiver, wireless bus protocol system, such as a Bluetooth™ or other means of local wireless communications) and an other device subsystem designated generally by reference 234.

The mobile device microprocessor 216 operates under stored program control with code or firmware being stored in the flash memory 218 (or other type of non-volatile memory device or devices). As depicted in FIG. 2, the flash memory 218 includes stored programs (e.g., firmware) including an operating system program or code module 240 and other programs or software applications indicated generally by reference 242. The software applications 242 can, for example, include a World Wide Web (WWW) browsing application 244 and an e-mail client application 246.

According to example embodiments, the software applications 242 of the mobile device 140 further include a memory card driver 248 that may be used in conjunction with the card reader 110. Notably, the memory card driver 248 may be provided, not by the manufacturer of the mobile device 140, but, instead, by a third party, i.e., the manufacturer of the memory card 120. Furthermore, an Application Programming Interface (API) may be built in to the memory card driver 248 to allow the mobile device 140 to communicate with the memory card 120 through the card reader 110.

The software applications 242 of the mobile device 140 may further include a smart card reader (SCR) pairing and security module 250 for coordinating a pairing process between the mobile device 140 and the card reader 110. The roles of the memory card driver 248 and the smart card reader pairing and security module 250 will be described in greater detail below.

The operating system code 240, code for specific device applications 242, code for the WWW browsing application 244, code for the e-mail client application 246, code for the memory card driver 248, or code for the smart card reader pairing and security module 250 may be temporarily loaded into a volatile storage medium such as the RAM 220 during operation of the mobile device 140. Received communication signals and other data with information may also be stored in the RAM 220. In some embodiments, the mobile device 140 may include, in addition to the internal flash memory 218, persistent memory carried on a SIM (Subscriber Identity Module) card, or other removable device, and at least some of the flash memory 218 may be allocated to the SIM card flash memory.

The stored program control (i.e., the software applications 242) for the mobile device microprocessor 216 also includes a predetermined set of applications, code components or software modules that control basic device operations, for example, data and voice communication applications which are normally installed on the mobile device 140 as the software applications 242 during the manufacturing process. Further applications may also be loaded (i.e., downloaded) onto the mobile device 140 through the operation of networks described above, the auxiliary I/O subsystem 222, the serial port 224 or the mobile device short-range communications subsystem 232. The downloaded code modules or components are then installed by the user (or automatically) in the RAM 220 or the non-volatile program memory (e.g., the flash memory 218).

The serial port 224 comprises a USB-type interface port for interfacing or synchronizing with another device, such as a desktop or notebook computer (PC 130). The serial port 224 is used to set preferences through an external device or software application. The serial port 224 is also used to extend the capabilities of the mobile device 140 by providing for information or software downloads, including user interface information, to the mobile device 140 other than through a wireless communication network. In one embodiment, the serial port 224 may be used to communicate with card reader 110.

The mobile device short-range communications subsystem 232 provides an interface for communication between the mobile device 140 and other devices, including the card reader 110. For example, the mobile device short-range communications subsystem 232 may employ an infrared communication link or channel, or may operate according to a wireless bus protocol, such as Bluetooth™, or any other localized wireless means of communication.

Figure 3:
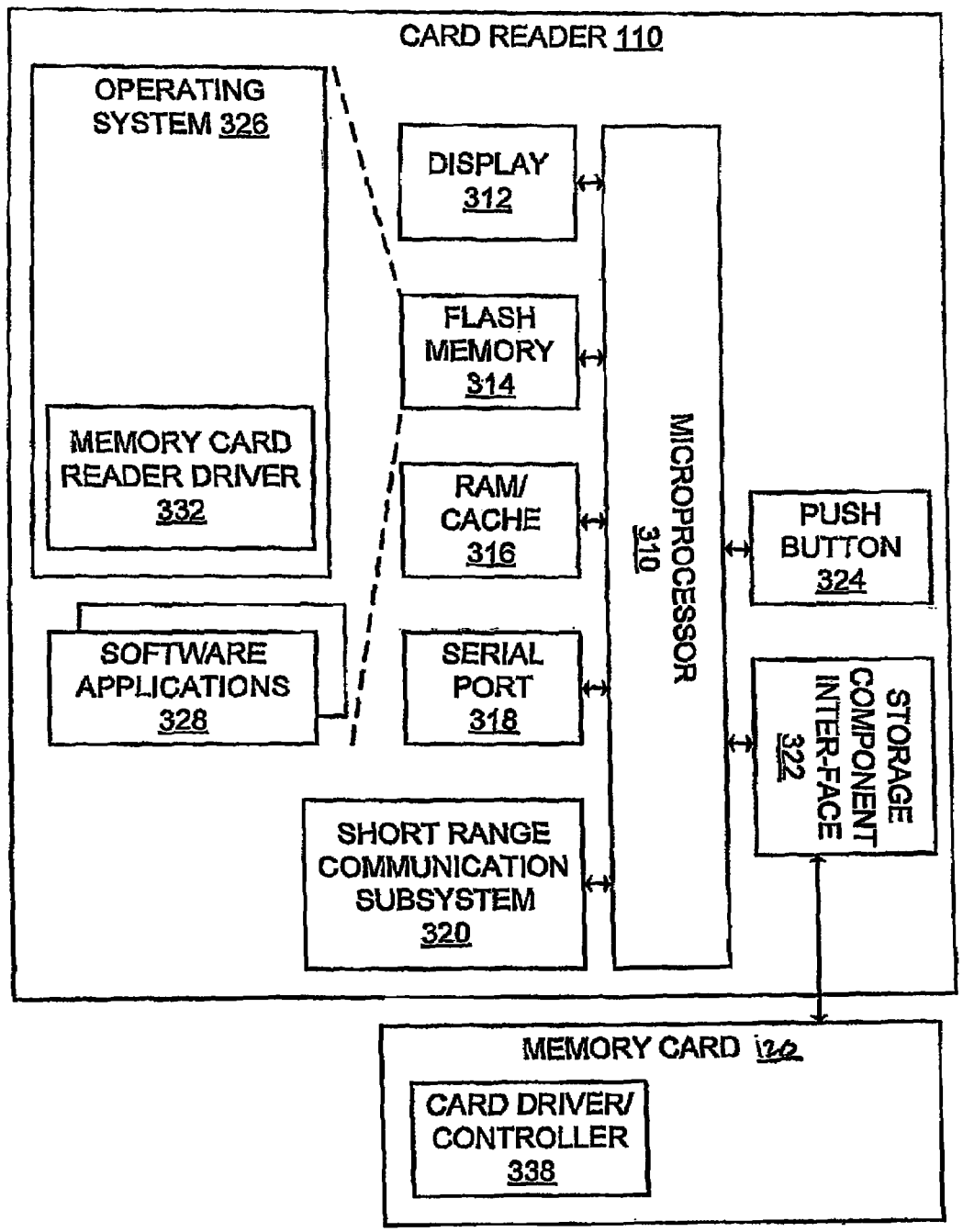
FIG. 3 is a block diagram of a memory card reader for use in the system of FIG. 1.

FIG. 3 illustrates an example embodiment of the card reader 110, in the exemplary form of a smart card reader. The card reader 110 includes a controller including at least one smart card reader microprocessor 310, which is suitably programmed to control the overall operation and functions of the card reader 110. The card reader 110 also includes an output device 312 (e.g., a display module). The card reader 110 further includes peripheral devices or subsystems such as a flash memory 314, a random access memory (RAM) 316, which, in some embodiments, includes a portion allocated to a data cache, a serial port 318 (e.g., a USB port), a smart card reader short-range communications subsystem 320 (e.g., an infrared transceiver, wireless bus protocol system using a protocol such as a Bluetooth™), a storage component interface 322 (e.g., for a memory card or any other data storage device) and a pairing-activation input device 324 (e.g., a push button).

The smart card reader microprocessor 310 operates under stored program control with code or firmware being stored in the flash memory 314 (or other type of non-volatile memory device or devices). As depicted in FIG. 3, the stored programs (e.g., firmware) include an operating system program or code module 326 and other programs or software applications indicated generally by reference 328. The operating system 326 of the card reader 110 further includes a memory card reader driver component 332.

The memory card reader driver component 332 is responsible for coordinating communications between the card reader 110 and a memory card 120 and/or the memory card driver 248 of the mobile device 140 (via wired or wireless communication link 114).

The operating system code 326, code for specific device applications 328, code for the memory card reader driver component 332, or code components thereof, may be temporarily loaded into a volatile storage medium such as the RAM 316. Received communication signals and other data may also be stored in the RAM 316. Additionally, the storage component interface 322 receives the removable memory card 120, providing additional storage space for the card reader 110.

In one embodiment, the memory card 120 has a card driver and controller 338 responsible for coordinating communications between the memory card 120 and the memory card reader driver component 332 of the smart card reader 110. While operation of the card reader 110 is described in a context wherein the memory card 120 is a smart card, it will be understood by those skilled in the art that the card reader 110 may be designed to operate with any suitable form of memory device.

The stored program control (i.e., software applications 328) for the smart card reader microprocessor 310 may include a predetermined set of applications, code components or software modules that control basic device operations, for example, management and security related control of the data of the card reader 110, and may be installed on the card reader 110 as a component of the software applications 328 during the manufacturing process. Further applications may also be loaded (i.e., downloaded) onto the card reader 110 through the operation of the serial port 318, the smart card reader short-range communications subsystem 320 or from the memory card 120. The downloaded code module or components are then installed by the user (or automatically) in the RAM 316 or non-volatile program memory (e.g., the flash memory 314).

While the memory card reader driver component 332 is shown to be an integrated portion of the operating system 326 for security purposes (e.g., individuals must not be permitted to tamper with the memory card reader driver component 332), the memory card reader driver component 332 could be installed as one of the software applications 328 so long as suitable security related precautions are taken to ensure that the memory card reader driver component 332 cannot be modified or tampered with by unauthorized users.

The serial port 318 may be a USB-type interface port for interfacing or synchronizing with another device, such as personal computer 130 or mobile device 140. The serial port 318 is used to set preferences through an external device or software application or exchange data with a device, such as the mobile device 140. Such data may be stored on the memory card 120 that is plugged into the storage component interface 322 of the card reader 110. The serial port 318 is also used to extend the capabilities of the card reader 110 by providing for downloads, to the card reader 110, of information or software, including user interface information.

The short-range communications subsystem 320 provides an interface for communication between the mobile device 140 or personal computer 130 and the card reader 110. In one embodiment, the short-range communications subsystem 320 employs an infrared communication link or channel. In another embodiment, the short-range communications subsystem 320 operates according to a wireless RF bus protocol, such as Bluetooth™. However, the short-range communications subsystem 320 may operate according to any suitable local wired or wireless communication protocol, so long as the short-range communications subsystem 232 (FIG. 2) of the mobile device 140 operates using the same protocol, thereby facilitating wireless communication between the mobile device 140 and the card reader 110. Any communications mechanism and/or protocol may be implemented for the short-range communications subsystems 232, 320, so long as the mobile device 140 and the card reader 110 can communicate with each other when within physical proximity.

Although not shown in FIG. 1 in relation to PC 130, PC 130 comprises a suitable short-range communication subsystem for facilitating wireless communication between PC 130 and card reader 110. For example, the short-range communication subsystem of the PC 130 may operate in a similar manner to the short-range communication subsystem 232 of the mobile device 140, for example using an infrared communication link or a wireless RF bus protocol such as Bluetooth™. Alternatively, the PC 130 may employ a suitable serial interface for communication with card reader 110, for example using a USB cable.

Figure 4:
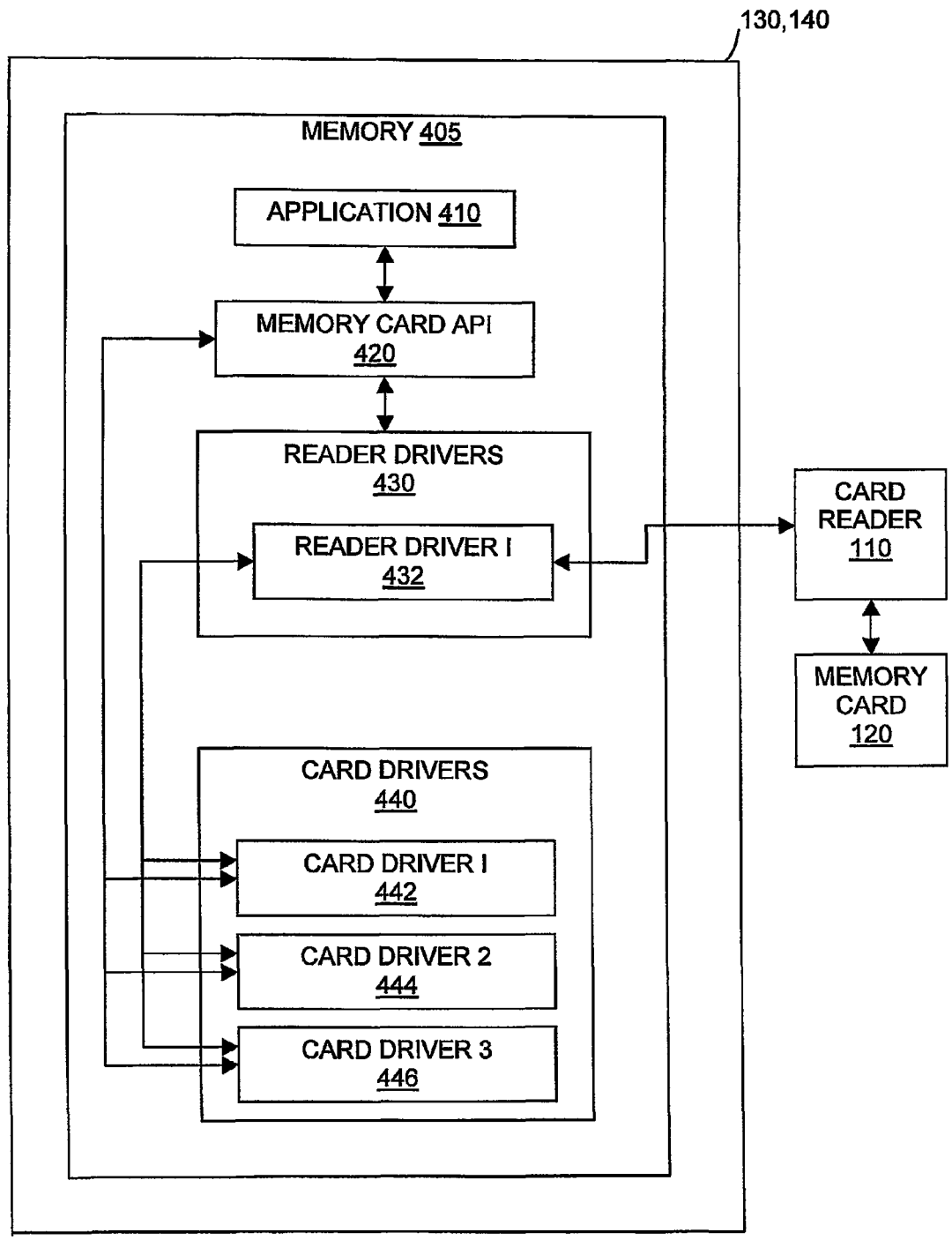
FIG. 4 is a block diagram illustrating software modules operating on an accessing device.

Referring now to FIG. 4, a block diagram of an accessing device, such as PC 130 or mobile device 140, is shown in further detail, with reference to functions concerning recognition of memory card 120 and ascertaining whether the accessing device 130, 140 supports the memory card 120.

The accessing device 130, 140 has a memory 405 that corresponds to flash memory 218 of mobile device 140 or a similarly configured non-volatile memory of PC 130. Memory 405 stores program code executable by a processor, such as microprocessor 216, for performing the functions described below in relation to FIGS. 5 and 6 to determine whether accessing device 130, 140 recognizes and/or supports memory card 120. Memory 405 comprises program code in addition to the modules shown and described in relation to FIG. 4, but the description of such additional program code is omitted to avoid obscuring the described embodiments.

Memory 405 comprises an active application 410, such as e-mail message viewer 246, a memory card application program interface (API) 420, reader drivers 430 and card drivers 440. The memory card API 420 communicates with reader drivers 430 and card drivers 440 to govern communication between accessing device 130, 140 and memory card 120 via card reader 110.

Memory 405 stores a plurality of reader drivers 430 for interfacing with a respective plurality of types of card reader 110. For purposes of the present description, it is assumed that at least a first reader driver 432 supports the type of card reader 110. Accordingly, the first reader driver 432 facilitates communication between card drivers 440, memory card API 420 and memory card 120.

Memory 405 also stores a plurality of card drivers 440, including a first card driver 442, a second card driver 444 and a third card driver 446. The number of card driver modules stored in memory 405 may be greater or fewer than the first, second and third card drivers 442, 444 and 446, but only three such card driver modules are described for illustrative purposes, as part of an exemplary embodiment.

Interaction of program code modules within memory 405 with each other and with card reader 110 and memory card 120 is described below, with reference to the methods illustrated in FIGS. 5 and 6.

Figure 5:
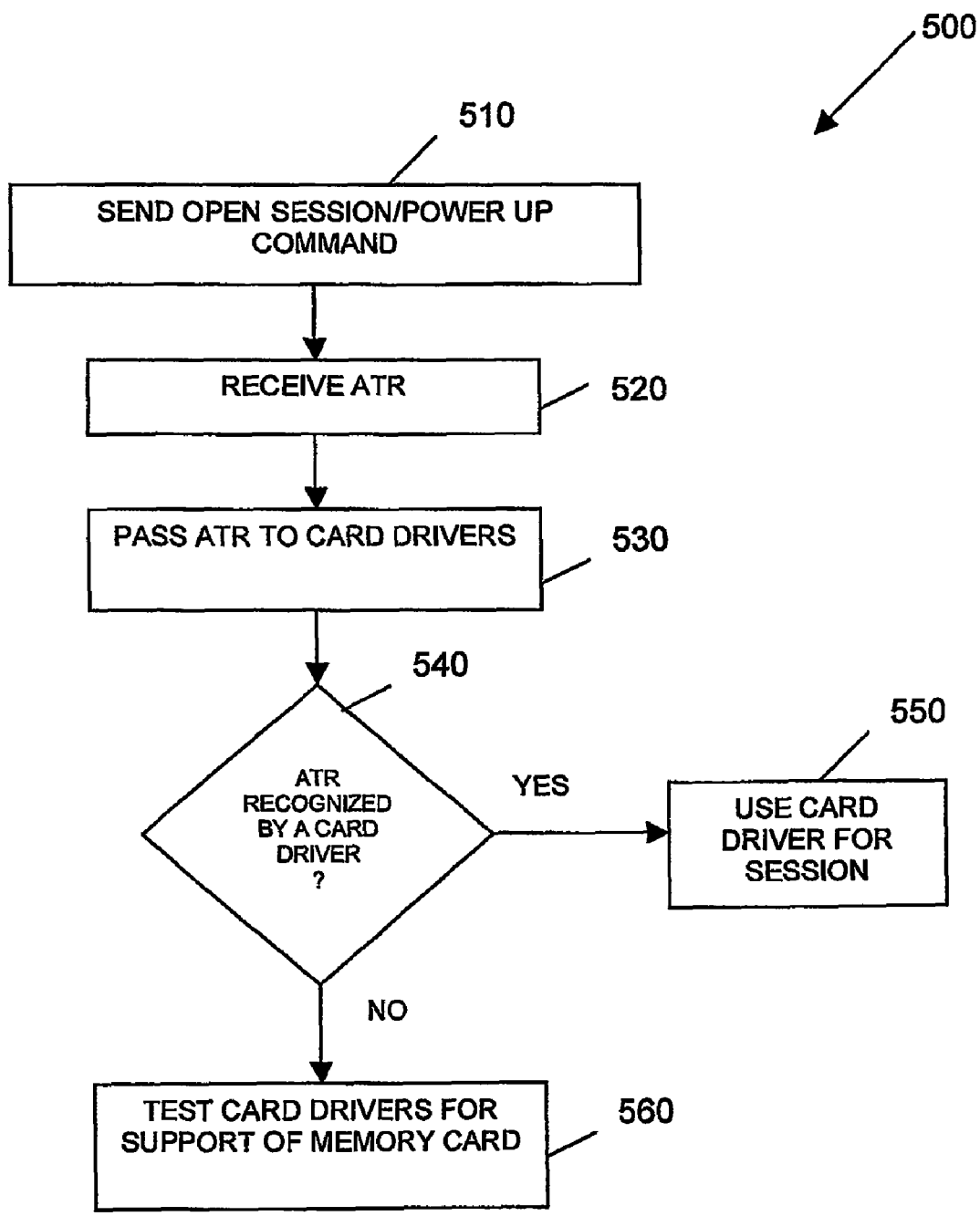
FIG. 5 is a flowchart of a method of determining recognition of a memory card.
Figure 6:
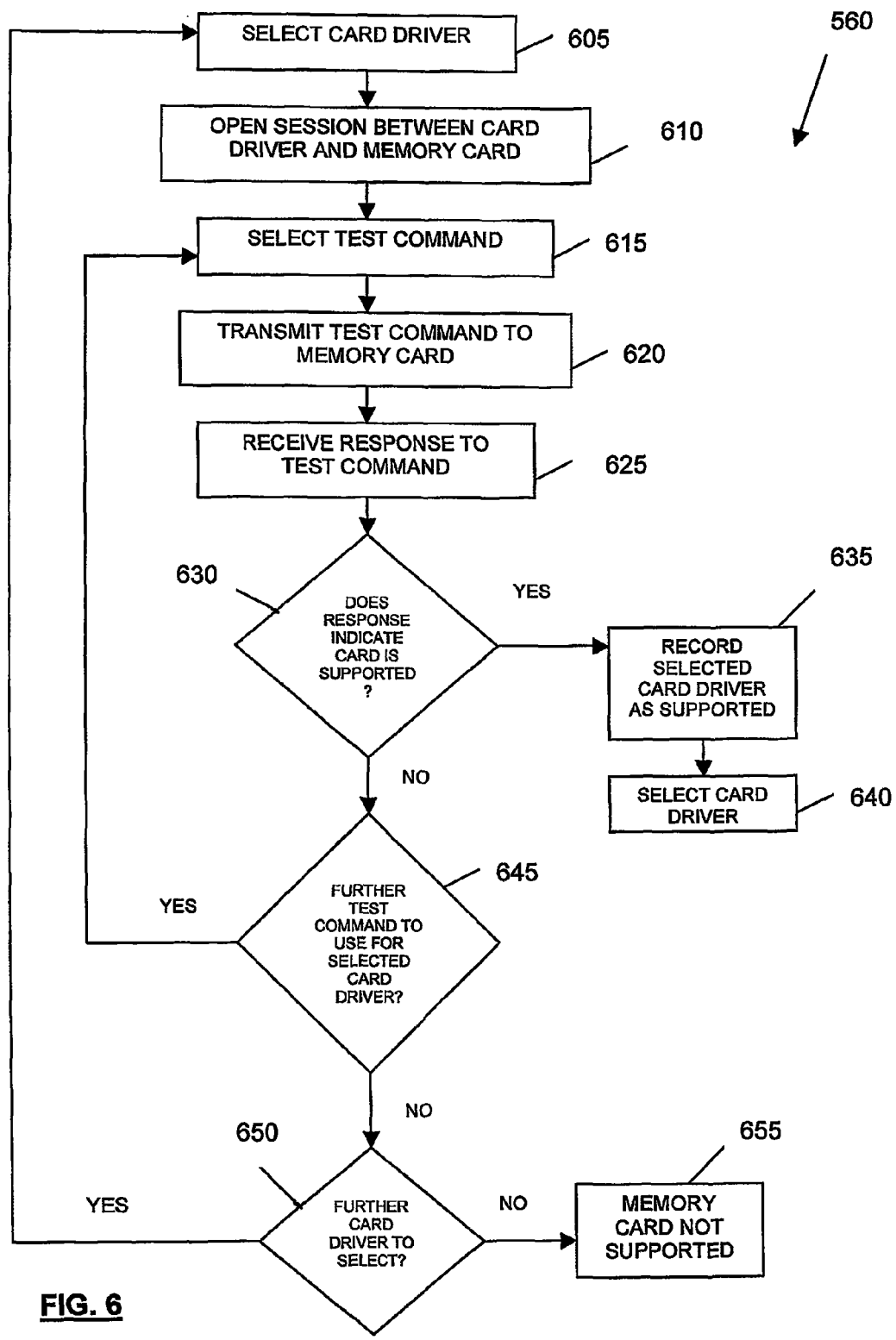
FIG. 6 is a flowchart of a method of testing for support for a memory card.

FIG. 5 illustrates one embodiment of a method 500 of determining recognition of a memory card. Method 500 begins at step 510, in which the accessing device 130, 140 sends an open session/power up command to the memory card 120. Commonly, the memory card 120 will power down when not in use. Thus, accessing device 130,140 may assume that the memory card 120 is in a powered down state and will transmit an open session command, in the form of a power up command, to the memory card 120 as a way of initiating the process of opening a session between the accessing device 130, 140 and memory card 120. This form of opening a session with the memory card 120 is called a cold reset. If the memory card 120 is already in a powered up state, then the card reader 110 will receive the power up command and convert it to a warm reset command and communicate it to memory card 120. The power up command from accessing device 130, 140 is intercepted and handled by card reader 110, which will then interface with memory card 120 by transmitting a cold reset or warm reset, as appropriate.

In response to the open session command (cold or warm reset), the memory card 120 may transmit an Answer to Reset (ATR) response, according to the ISO 7816 standard for smart cards. If memory card 120 is not a smart card and/or does not follow the ISO 7816 standard, a suitable alternative form of response may be provided by memory card 120 to accessing device 130, 140 that identifies, or that contains data that would indicate, the card type of memory card 120 in a manner that would enable a card driver to determine whether it supports the card type or not.

Upon receipt of the ATR or other form of response at step 520, memory card API 420 stores the ATR within memory 405.

At step 530, memory card API 420 provides the ATR or other form of response to card drivers 440 and commands each of the first, second and third card drivers 442, 444 and 446 to provide a Boolean (true or false) response indicating whether it recognizes the historical bytes of the ATR. Card drivers 440 may also check the whole ATR or bytes other than the historical bytes. For alternative forms of response, each of the card drivers 440 checks a part of the response that would indicate the card type of memory card 120. Each of the card drivers 440 may be thus interrogated by memory card API 420 in sequence or simultaneously.

If, at step 540, one or more of the card drivers 440 recognizes the ATR or other form of response as indicating a particular card type supported by the respective card driver, such an indication is transmitted to memory card API 420 as a positive (true) response. At step 550, if only one card driver indicates that it supports the card type of memory card 120, that card driver is used for conducting the session between the accessing device 130, 140 and memory card 120. If more than one card driver indicates that it supports the card type, one of the card drivers may be arbitrarily chosen or the user of the accessing device 130, 140 may be invited to select the driver to be used for the session.

Memory card API 420 maintains a table of card types supported by the various card drivers 440. For example, the ATR received from memory card "XYZ" may be recorded in the table as being recognized by the first card driver 442, while the ATR received from memory card "ABC" may be recorded in the table as being recognized by second and third card drivers 444 and 446.

In one embodiment, as a precursor to step 530 and following receipt of the ATR at step 520, memory card API 420 may check the ATR against the table to determine whether it has previously been recognized or otherwise determined to be supported. If the ATR received at step 520 is included in the table, the corresponding card driver that supports it will be used for the session with the memory card 120. In this way, accessing device 130, 140 can effectively use the results of previous efforts to determine support for a particular card type to increase efficiency in subsequent attempts to identify a suitable card driver. Thus, maintaining a table of card types supported by card drivers 440 can avoid testing the same card twice. Alternatively, or in addition, each card driver may store a corresponding table of the card types and/or ATRs or other responses that it recognizes or supports. This is described in further detail below, with reference to step 635.

If, at step 540, none of the card drivers 440 recognizes the ATR or other form of response as indicating a respective supported card type, the memory card API 420 receives the corresponding negative (false) responses from the card drivers 440 and initiates further testing of the card drivers for support of memory card 120, at step 560. Step 560 is described in further detail below, with reference to FIG. 6. If the memory card 120 is determined at step 560 to be supported by one or more card drivers, this is recorded in the table maintained by the memory card API 420.

The process of testing for support of memory card 120 is described with reference to the steps illustrated in FIG. 6. This process is only performed if none of the card drivers 440 recognized the response at step 540.

Beginning at step 605, memory card API 420 selects one of the card drivers 440 to determine whether that card driver might support the card type of memory card 120, despite not recognizing the ATR or other form of response at step 540.

At step 610, the selected card driver is instructed by memory card API 420 to initiate a test procedure described below in relation to steps 615 to 645. Step 610 includes opening a session between the selected card driver and memory card 120 so that the selected card driver can transmit test commands to the memory card 120.

At step 615, the selected card driver selects a test command to transmit, at step 620, to the memory card 120 so that, from a response received at step 625, the card driver can determine at step 630 whether the card type of memory card 120 appears to be supported. The test command selected at step 615 may be one of a list of possible test commands appropriate to the card type supported by the selected card driver. Alternatively, only one such test command may be available for selection at step 615 for the selected card driver.

If the response received from memory card 120 at step 625 is not recognized at step 630 by the selected card driver, then at step 645 the selected card driver determines whether any further test commands remain in the list that can be transmitted to the memory card 120 at step 620. If such further test commands can be transmitted, then steps 615 to 645 are repeated for each further test command in the list of possible test commands for the selected card driver.

If, at step 630, a response received from memory card 120 indicates that the memory card 120 is supported by the selected card driver, for example by indicating that the test command was successful, the selected card driver may record in a table specific to that card driver that the card type of memory card 120 is supported by that card driver. The selected card driver transmits a (true) response to memory card API 420, at step 635, indicating that the selected card driver supports the card type of memory card 120. Each of the card drivers 440 may maintain a table stored in memory 405 to indicate one or more card types supported by the respective card driver.

At step 640, the selected card driver that supports the selected card type may be used for communicating with the memory card 120. Once the selected card driver determines that it supports the card type of memory card 120, it can maintain the session that it opened with the memory card 120 and let the application 410 (through memory card API 420) use the opened session. Alternatively, the selected card driver may close the session with memory card 120 and wait for an accessing application, such as application 410 to request a new session via memory card API 420 using the selected card driver.

If, at step 645, no further test command is available, for example because all test commands in the list have been tried, then the selected card driver returns a negative (false) response to memory card API 420, at step 650. The memory card API 420 then determines, as part of step 650, whether there is a further card driver that can be selected for testing support. If, at step 650, the memory card API 420 determines that there is another card driver among card drivers 440 that has not been tested for support of the card type of memory card 120, then steps 605 to 645 are repeated for the newly selected card driver. On the other hand, if memory card API 420 determines that all card drivers have been tested for support without any positive (true) responses, memory card API 420 determines, at step 655, that the card type of memory card 120 is not supported by any of the card drivers 440 and an indication to that effect may be provided to the user of the accessing device 130, 140.

Process 560 may be performed so as to select the first card driver that is determined to support the card type of memory card 120. Alternatively, process 560 may iterate through the possible test commands for each selected card driver and/or through all of the card drivers 440 in an exhaustive manner to determine all card drivers that might support the card type of memory card 120, in which case the user would be invited to select among multiple such supporting card drivers. Further, where multiple card drivers are determined to support the memory card 120, the user may be invited to select which driver to use for each different application 410 that seeks to initiate a session with memory card 120.

Examples of test commands that may be available for selection by a selected card driver include one or more of the following:

1. A file selection command to select a file, such as a digital certificate file, which is known to be at a certain location on the memory card of the card type supported by the selected card driver. If the memory card 120 responds by indicating that the command was successful, it indicates that the selected file is present in the expected location and that the card type is therefore supported.
2. A file read command to read a file from a smart card to parse the data to see if it is data which would be expected from the card type supported by the selected card driver.
3. A command specific to the card type. For example, for smart cards conforming to the ISO 7816 standard, Application Protocol Data Unit (APDU) commands specific to a card type supported by the card driver may be transmitted to memory card 120. If memory card 120 responds indicating that the command was successful, this indicates that the card type of memory card 120 corresponds to a card type supported by the selected card driver.

For a CAC card, an example of test command 1 above may be a command to select the three certificate files commonly on such cards and then read the first part of the certificate to determine whether it is of an expected format or content. An example of test command 2 for a CAC card may be a read command to read the unique identifier from the card. If the unique identifier is of a particular format or content consistent with the card type supported by a card driver, the test command may be considered to be successful. Other types of test command may be used that are specific to a particular card type and that would tend to indicate, if successful, that the card driver transmitting the test command supports that particular card type.

It should be understood that variations and modifications can be made to the embodiments described and illustrated herein without departing from the spirit of the described embodiments, the general scope of which is defined in the appended claims.

The invention claimed is:

1. A method of testing support for a memory card, wherein the memory card is accessible to a card reader and the card reader is in communication with an accessing device, the method comprising:
   transmitting a session request from the accessing device to the memory card via the card reader;
   receiving at the accessing device, an Answer to Reset response to the session request from the memory card;
   determining, for each of a plurality of card drivers on the accessing device, that the Answer to Reset response indicates that a card type of the memory card is not supported by the card driver; and
   automatically in response to said determining, for a selected card driver of said plurality of card drivers:
   transmitting a test command to the memory card, the test command being specific to a card type supported by the selected card driver;
   receiving a response to the test command; and
   if the response to the test command indicates that the test command was successful, indicating that the selected card driver, which was previously determined not to support the card type of the memory card, supports the card type of the memory card.

2. The method of claim 1, wherein the test command is selected from a plurality of different test commands.

3. The method of claim 2, wherein said transmitting the test command, said receiving the response to the test command, and said indicating, are repeated for each of the plurality of different test commands until a respective response to the test command indicates that the test command was successful or that no response to any of the plurality of different test commands was successful.

4. The method of claim 2, wherein the test command is selected from the group consisting of: a file selection command to select a file at a specific location on the memory card; a file read command to read a unique identifier of the memory card; and a command specific to the card type of the memory card.

5. The method of claim 4, wherein the file selection command selects one or more certificate files normally located at the specific location for the card type of the memory card.

6. The method of claim 1, wherein said transmitting the test command, said receiving the response to the test command, and said indicating, are repeated for each of the plurality of card drivers until a selected card driver is determined to support the card type of the memory card or until none of the plurality of card drivers is determined to support the card type of the memory card.

7. The method of claim 1, wherein said transmitting the test command comprises opening a session between the selected card driver and the memory card, during which the test command is transmitted and the response to the test command is received.

8. The method of claim 1, further comprising, if the response to the test command indicates that the test command was successful, recording in a table that the selected card driver supports the card type of the memory card.

9. The method of claim 1, wherein the memory card comprises a smart card.

10. The method of claim 9, wherein the smart card comprises a common access card.

11. The method of claim 1, wherein the accessing device comprises a mobile electronic device.

12. The method of claim 1, wherein the accessing device comprises a personal computer.

13. A system for testing support for a memory card, wherein the memory card is accessible to a card reader and the card reader is in communication with an accessing device, the system comprising:
   a processor within an accessing device in communication with the card reader;
   a memory accessible to the processor, the memory storing program code executable by the processor, the program code comprising a plurality of card driver modules and a card interface module;

wherein the card interface module is configured to facilitate communication with the memory card and the card driver modules; and wherein the card interface module is further configured to:

transmit a session request from the accessing device to the memory card via the card reader;

receive, at the accessing device, an Answer to Reset response to the session request from the memory card;

determine, for each of the plurality of card driver modules, that the Answer to Reset response indicates that a card type of the memory card is not supported by the card driver; and in response to a determination that the card driver module fails to recognize the Answer to Reset response, for a selected card driver module of said plurality of card driver modules:

transmit a test command to the memory card, the test command being specific to a card type supported by the selected card driver module;

receive a response to the test command; and if the response to the test command indicates that the test command was successful, indicate that the selected card driver module, which was previously determined not to support the card type of the memory card, supports the card type of the memory card.

14. The system of claim 13, wherein the test command is selected from a plurality of different test commands.

15. The system of claim 14, wherein the card interface module is configured to repeat said transmit the test command, said receive the response to the test command, and said indicate, for each of the plurality of different test commands until a respective response to the test command indicates that the test command was successful or that no response to any of the plurality of different test commands was successful.

16. The system of claim 14, wherein the test command is selected from the group consisting of: a file selection command to select a file at a specific location on the memory card; a file read command to read a unique identifier of the memory card; and a command specific to the card type of the memory card.

17. The system of claim 16, wherein the file selection command selects one or more certificate files normally located at the specific location for the card type of the memory card.

18. The system of claim 13, wherein the card interface module is configured to repeat said transmit the test command, said receive the response to the test command, and said indicate, for each of the plurality of card driver modules until a selected card driver module is determined to support the card type of the memory card or until none of the plurality of card drivers is determined to support the card type of the memory card.

19. The system of claim 13, wherein the card interface module is configured to open a session between the selected card driver module and the memory card, during which the test command is transmitted and the response to the test command is received.

20. The system of claim 13, further comprising, if the response to the test command indicates that the test command was successful, recording in a table that the selected card driver module supports the card type of the memory card.

21. The system of claim 13, wherein the memory card comprises a smart card.

22. The system of claim 21, wherein the smart card comprises a common access card.

23. The system of claim 13, wherein the accessing device comprises a mobile electronic device.

24. The system of claim 13, wherein the accessing device comprises a personal computer.

25. A computer readable storage medium storing program instructions which, when executed by a processor, cause the processor to perform a method of testing support for a memory card, wherein the memory card is accessible to a card reader and the card reader is in communication with an accessing device, the method comprising:

transmitting a session request from the accessing device to the memory card via the card reader;

receiving at the accessing device, an Answer to Reset response to the session request from the memory card;

determining, for each of a plurality of card drivers on the accessing device, that the Answer to Reset response indicates that a card type of the memory card is not supported by the card driver; and in response to said determining, for a selected card driver of said plurality of card drivers:

transmitting a test command to the memory card, the test command being specific to a card type supported by the selected card driver;

receiving a response to the test command; and if the response to the test command indicates that the test command was successful, indicating that the selected card driver, which was previously determined not to support the card type of the memory card, supports the card type of the memory card.

* * * * *